(12) United States Patent
Lee et al.

(10) Patent No.: US 10,276,444 B2
(45) Date of Patent: Apr. 30, 2019

(54) METHOD OF FORMING OXIDE LAYER FOR FINFET DEVICE

(71) Applicant: Taiwan Semiconductor Manufacturing Co., Ltd., Hsin-Chu (TW)

(72) Inventors: Ching-Hua Lee, Hsinchu (TW); Jung-Wei Lee, Hsinchu (TW); Wen-Chieh Huang, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/724,650

(22) Filed: Oct. 4, 2017

(65) Prior Publication Data
US 2018/0374754 A1 Dec. 27, 2018

Related U.S. Application Data

(60) Provisional application No. 62/525,647, filed on Jun. 27, 2017.

(51) Int. Cl.
| H01L 21/8234 | (2006.01) |
| H01L 21/285 | (2006.01) |
| H01L 29/06 | (2006.01) |
| H01L 29/66 | (2006.01) |
| H01L 21/02 | (2006.01) |

(52) U.S. Cl.
CPC ........ *H01L 21/823431* (2013.01); *H01L 21/02614* (2013.01); *H01L 21/28556* (2013.01); *H01L 29/0649* (2013.01); *H01L 29/6681* (2013.01)

(58) Field of Classification Search
CPC ....... H01L 21/823431; H01L 21/02614; H01L 29/6681; H01L 21/28556; H01L 29/0649
See application file for complete search history.

(56) References Cited

U.S. PATENT DOCUMENTS

| 6,136,674 A * | 10/2000 | An | H01L 21/26506 438/585 |
| 2002/0127882 A1* | 9/2002 | Chen | H01L 21/26506 438/787 |
| 2008/0283910 A1* | 11/2008 | Dreeskornfeld | H01L 21/823431 257/332 |
| 2009/0114968 A1* | 5/2009 | Wang | H01L 21/26506 257/301 |
| 2010/0219481 A1* | 9/2010 | Tseng | H01L 21/28185 257/369 |
| 2013/0171767 A1* | 7/2013 | Moslehi | H01L 21/26586 438/89 |

* cited by examiner

*Primary Examiner* — Karen Kusumakar
(74) *Attorney, Agent, or Firm* — Duane Morris LLP

(57) ABSTRACT

A method for forming a fin-based transistor includes forming a fin on a substrate; overlaying at least an upper portion of the fin with nitrogen-based radicals, wherein the nitrogen-based radicals are distributed along a sidewall and over a top surface of the upper portion of the fin with respective different concentrations; and forming an oxide layer over the upper portion of the fin using a thermal oxidation process.

20 Claims, 18 Drawing Sheets

METHOD OF FORMING OXIDE LAYER FOR FINFET DEVICE

CROSS-REFERENCE TO RELATED APPLICATION

The present application claims priority to U.S. Provisional Patent Application No. 62/525,647, filed on Jun. 27, 2017, which is incorporated by reference herein in its entirety.

BACKGROUND

Integrated circuits typically include a large number of components, particularly transistors. One type of transistor is a metal-oxide-semiconductor field-effect-transistor (MOSFET). MOSFET devices typically include a gate structure on top of a semiconductor substrate. Both sides of the gate structure are doped to form source and drain regions. A channel is formed between the source and drain regions beneath the gate. Based on a voltage bias applied to the gate, electric current may either be allowed to flow through the channel or be inhibited from doing so.

In some cases, the channel may be formed as a fin-like structure (herein "fin"). Such a fin protrudes beyond a top surface of the substrate and runs perpendicular to the gate structure formed on the substrate and the fin. Typically, a gate dielectric layer (e.g., an oxide layer) is formed between the fin and the gate structure so as to allow the gate structure to provide optimal control over the electric current flowing through the channel.

A variety of thermal oxidation, vapor deposition (e.g., chemical vapor deposition (CVD), plasma-enhanced chemical vapor deposition (PECVD), etc.), and/or layer deposition (e.g., atomic layer deposition (ALD), plasma-enhanced layer deposition (PLD), etc.) techniques are used to form such an oxide layer. Forming an oxide layer with a conformal thickness over the fin (e.g., the channel) is generally a goal to pursue. The thermal oxidation techniques may encounter some issues to reach such a goal due to different crystal orientations of sidewall and top surface of the fin, respectively. Although the vapor and/or layer deposition techniques may be able to form a conformal oxide layer, the oxide layer may have a poor insulation quality. Accordingly, one or more post annealing processes are generally needed to cure the oxide layer. However, this post annealing process may cause atom loss (e.g., silicon loss) in the fin channel thereby forming defects, which disadvantageously impacts overall performance of such a fin-based transistor. Thus, conventional techniques to form an oxide layer in fin-based transistors are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

Figure 1:
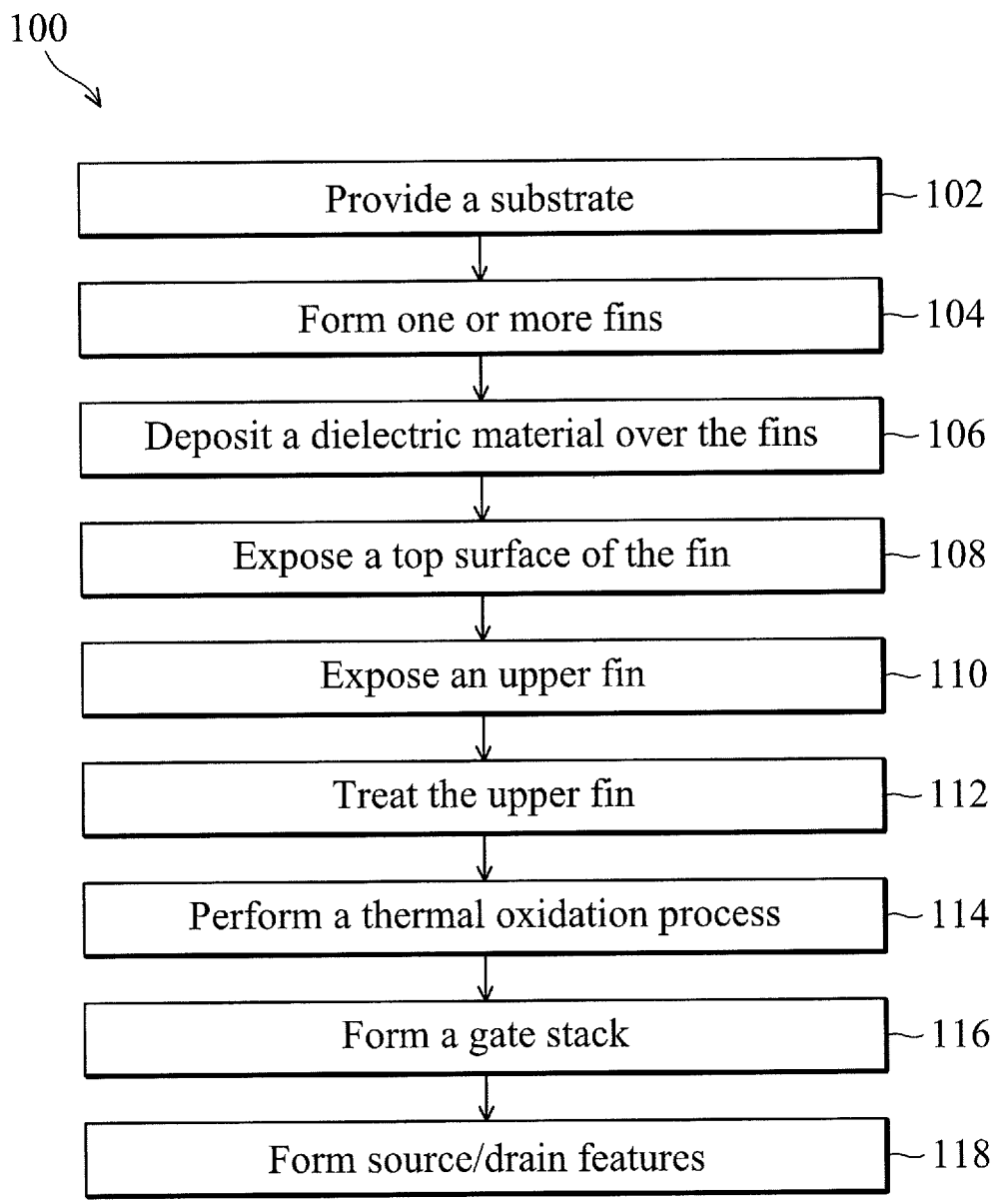
FIG. 1 illustrates a flow chart of an embodiment of a method to form a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of methods to form a semiconductor device that may be immune from the above-mentioned issue. More particularly, the present disclosure provides a method to form an oxide layer over a fin-like channel of a fin field-effect-transistor (FinFET). And, before the formation of the oxide layer, in some embodiments, the method includes using nitrogen-based radicals as a barrier layer to overlay the fin-like channel. In some embodiments, the nitrogen-based radicals may overlay sidewalls and a top surface of the fin-like channel in respective different surface densities, which may be due to different crystal orientations of the sidewalls and the top surface. By using such a non-uniform distribution of the nitrogen-based radicals along different crystal orientations, respective oxide growth rates along the different crystal orientations may be compensated. Accordingly, when forming the oxide layer using the thermal oxidation techniques, even with respective different oxide growth rates, the oxide layer may in turn have a substantially conformal thickness extending the sidewalls and the top surface of the fin-like channel. Moreover, in some embodiments, when the oxide layer is formed by the layer/vapor deposition techniques (e.g., ALD, PLD, CVD, etc.), in the later post annealing process to improve the quality of the oxide layer, the already formed barrier layer (of the nitrogen-based radicals) may prevent oxygen atoms from diffusing into the fin-like channel. Accordingly, the oxide layer may be formed with a conformal thickness by using the layer/vapor deposition techniques, and can still be cured by the post annealing process without losing atoms (e.g., silicon atoms) in the fin-like channel.

FIG. 1 illustrates a flowchart of a method 100 to form a semiconductor device according to one or more embodiments of the present disclosure. It is noted that the method 100 is merely an example, and is not intended to limit the present disclosure. In some embodiments, the semiconductor device is, at least part of, a FinFET. As employed in the present disclosure, the FinFET refers to any fin-based, multi-gate transistor. It is noted that the method of FIG. 1 does not produce a completed FinFET. A completed FinFET may be fabricated using complementary metal-oxide-semiconductor (CMOS) technology processing. Accordingly, it is understood that additional operations may be provided before, during, and after the method 100 of FIG. 1, and that some other operations may only be briefly described herein.

In some embodiments, the method 100 starts with operation 102 in which a semiconductor substrate is provided. The method 100 continues to operation 104 in which one or more fins are formed extending beyond a major surface of the semiconductor substrate. The method 100 continues to operation 106 in which a dielectric material is deposited over the semiconductor substrate. The method 100 continues to operation 108 in which respective top surfaces of the one or more fins are exposed. The method 100 continues to operation 110 in which an upper fin of each of the one or more fins is exposed. The method 100 continues to operation 112 in which a treatment process is performed on the upper fin so as to cause a plurality of nitrogen-based radicals to overlay a top surface and along sidewalls of the upper fin. The method 100 continues to operation 114 in which a thermal oxidation process is performed so as to form an oxide layer over each upper fin. The method 100 continues to operation 116 in which a gate stack is formed over a central portion of the oxide layer. The method 100 continues to operation 118 in which source/drain features are respectively formed at sides of the gate stack. The discussions, as follows, illustrating embodiments of a FinFET that can be fabricated according to the method 100 of FIG. 1.

FIGS. 2A, 3A, 4A, 5A, 6A, 7A, 8A, 9, and 10 illustrate, in a perspective view, a portion of a FinFET 200 at various fabrication stages, and FIGS. 2B, 3B, 4B, 5B, 6B, 7B, and 8B illustrate, in a cross-sectional view, a portion of the FinFET 200 at various fabrication stages. The FinFET 200 may be included in a microprocessor, memory cell, and/or other integrated circuit (IC). Also, FIGS. 2A through 10 are simplified for a better understanding of the concepts of the present disclosure. For example, although the figures illustrate the FinFET 200, it is understood the IC may comprise a number of other devices comprising resistors, capacitors, inductors, fuses, etc.

Figure 2A:
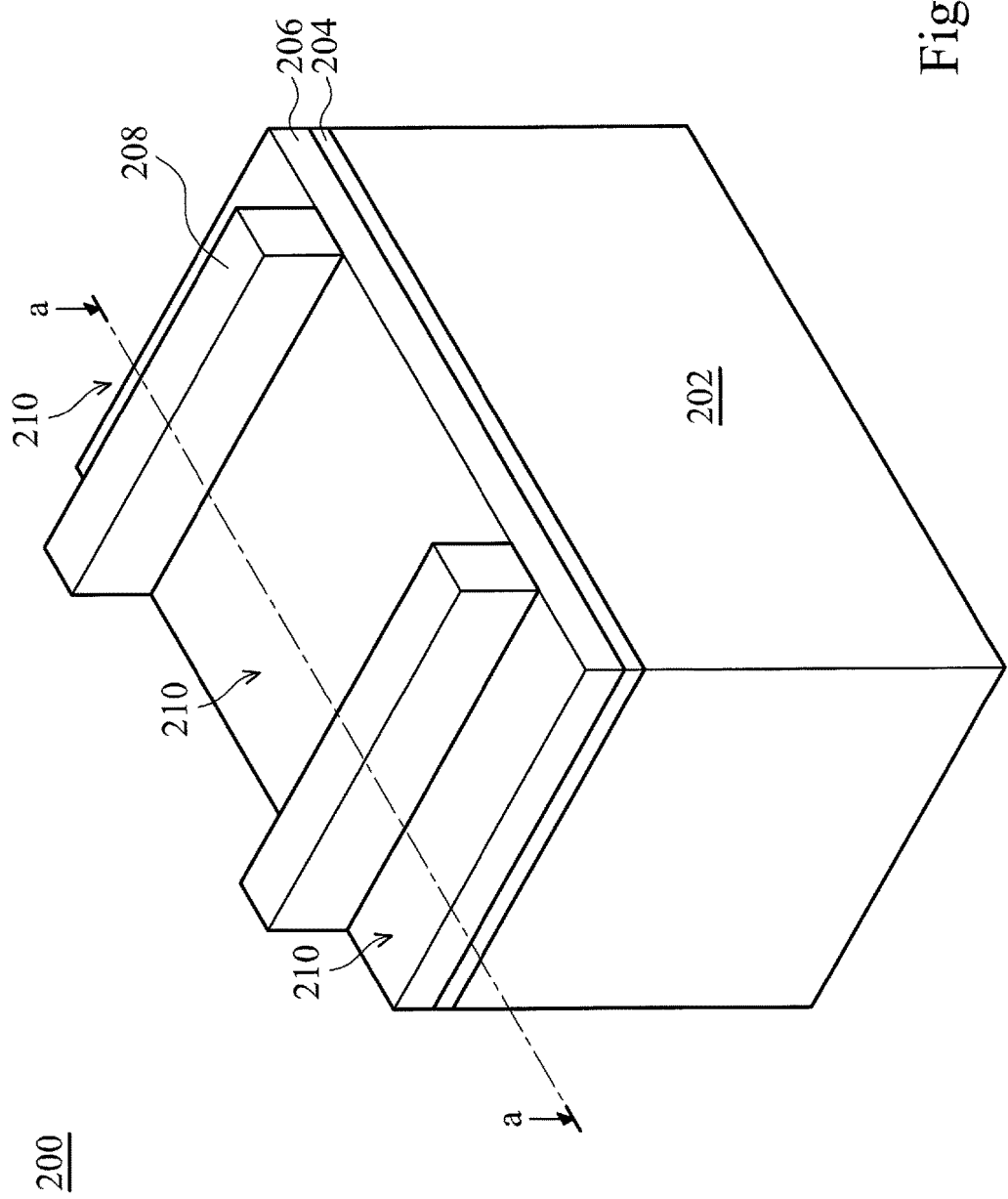
FIGS. 2A, 3A, 4A, 5A, 6A, 7A, 8A, 9, and 10 illustrate perspective views of an exemplary semiconductor device during various fabrication stages, in accordance with some embodiments.
Figure 2B:
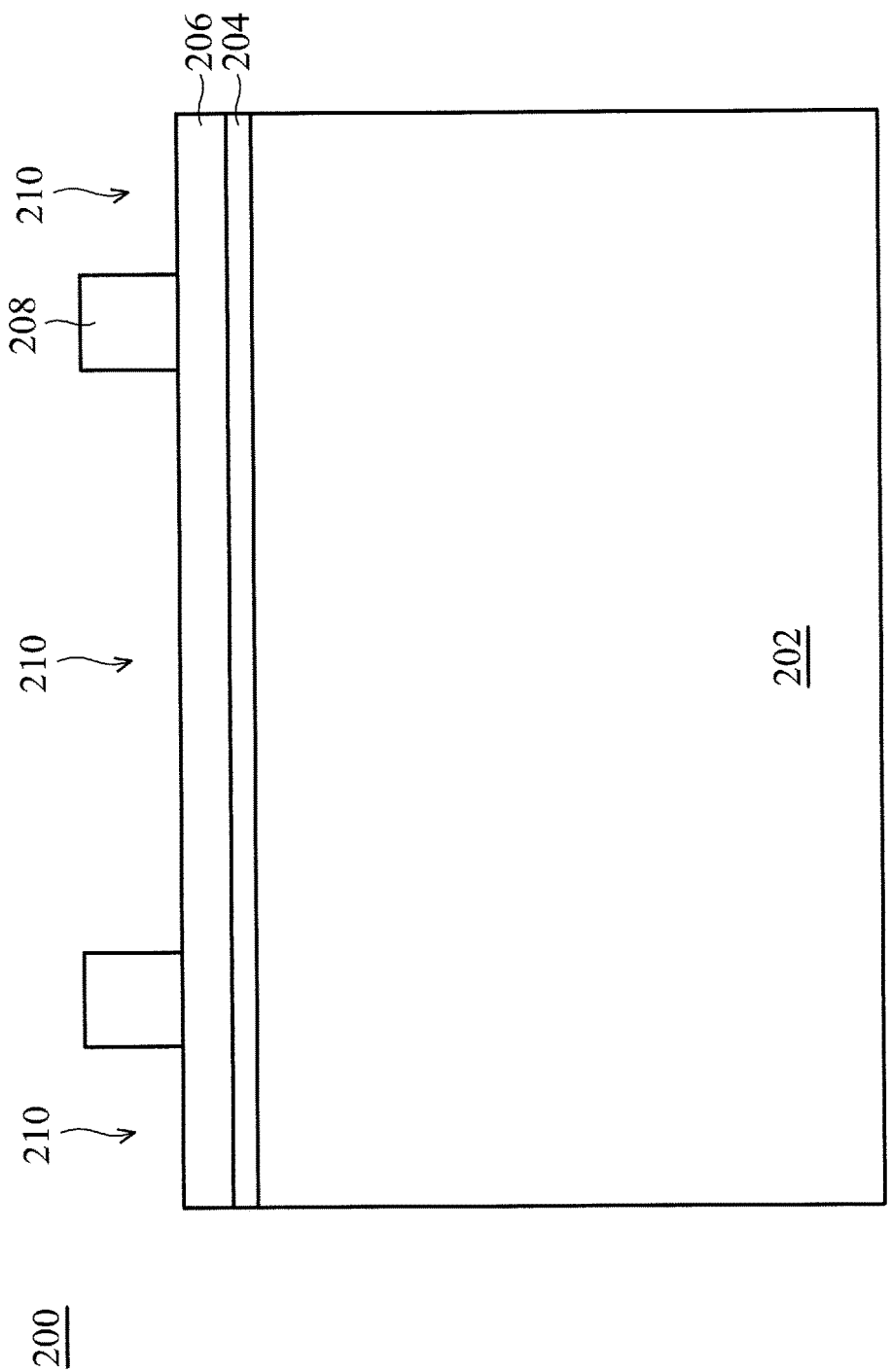
FIGS. 2B, 3B, 4B, 5B, 6B, 7B, and 8B illustrate corresponding cross-sectional views of FIGS. 2A, 3A, 4A, 5A, 6A, 7A and 8A, in accordance with some embodiments.

FIG. 2A is a perspective view of the FinFET 200 including a substrate 202 at one of the various stages of fabrication according to some embodiments, and FIG. 2B is a cross-sectional view of the FinFET 200 taken along line a-a of FIG. 2A. As shown, the substrate 202 is covered by a pad layer 204, a mask layer 206, and a photo-sensitive layer 208 that is patterned with one or more openings 210. The photo-sensitive layer 208 is patterned to form fin(s) of the FinFET 200, which will be discussed in the following operations.

In some embodiments, the substrate 202 comprises a crystalline silicon substrate (e.g., wafer). The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some alternative embodiments, the substrate 202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

In some embodiments, the pad layer 204 may be a thin film comprising silicon oxide Ruined, for example, using a thermal oxidation process. The pad layer 204 may act as an adhesion layer between the semiconductor substrate 202 and the mask layer 206. The pad layer 204 may also act as an etch stop layer while etching the mask layer 206. In some embodiments, the mask layer 206 is formed of silicon nitride, for example, using low-pressure chemical vapor deposition (LPCVD) or plasma enhanced chemical vapor deposition (PECVD). The mask layer 206 is used as a hard mask during subsequent photolithography processes. The photo-sensitive layer 208 is formed on the mask layer 206, and then patterned thereby forming the openings 210 in the photo-sensitive layer 208.

Figure 3A:
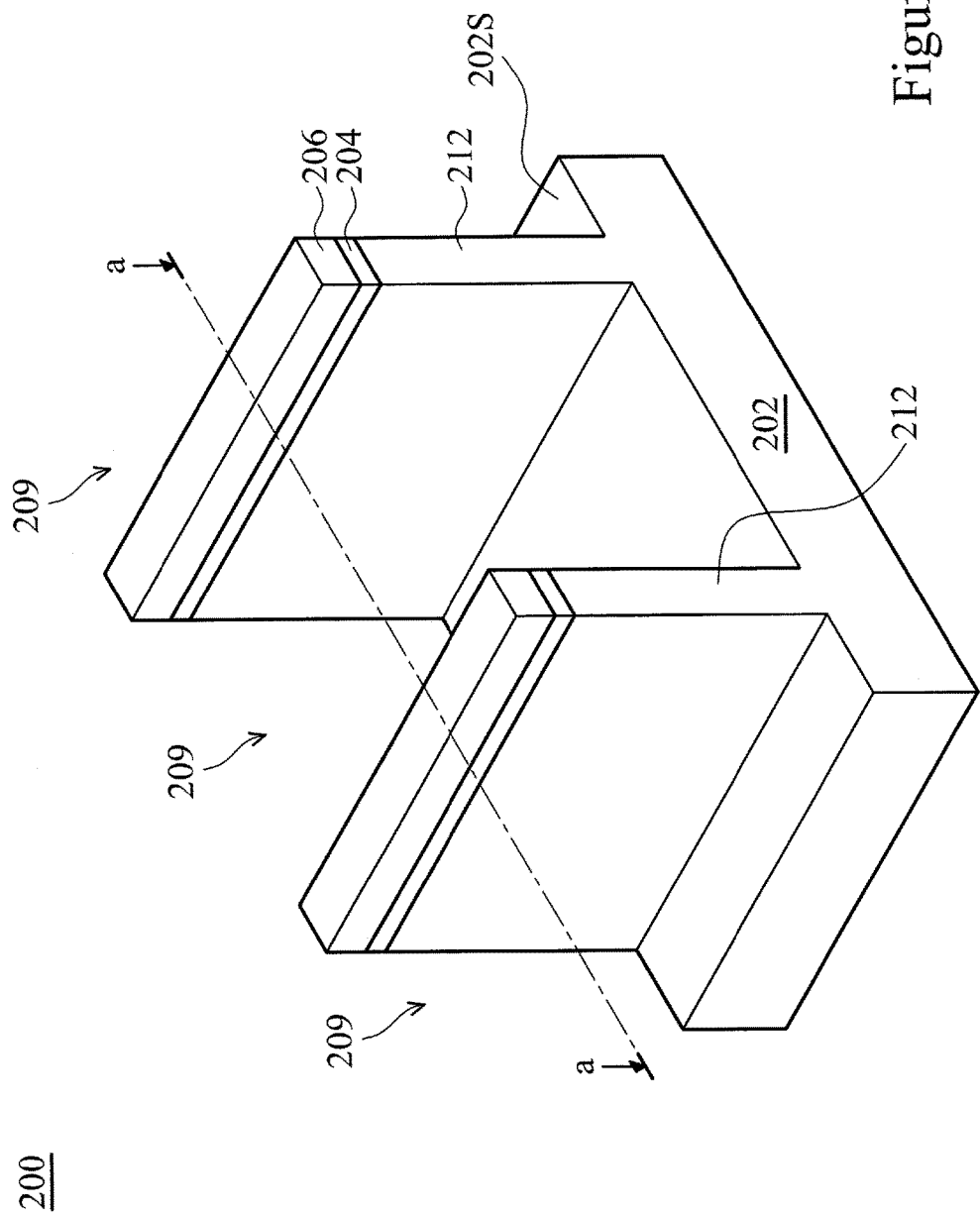
Figure 3B:
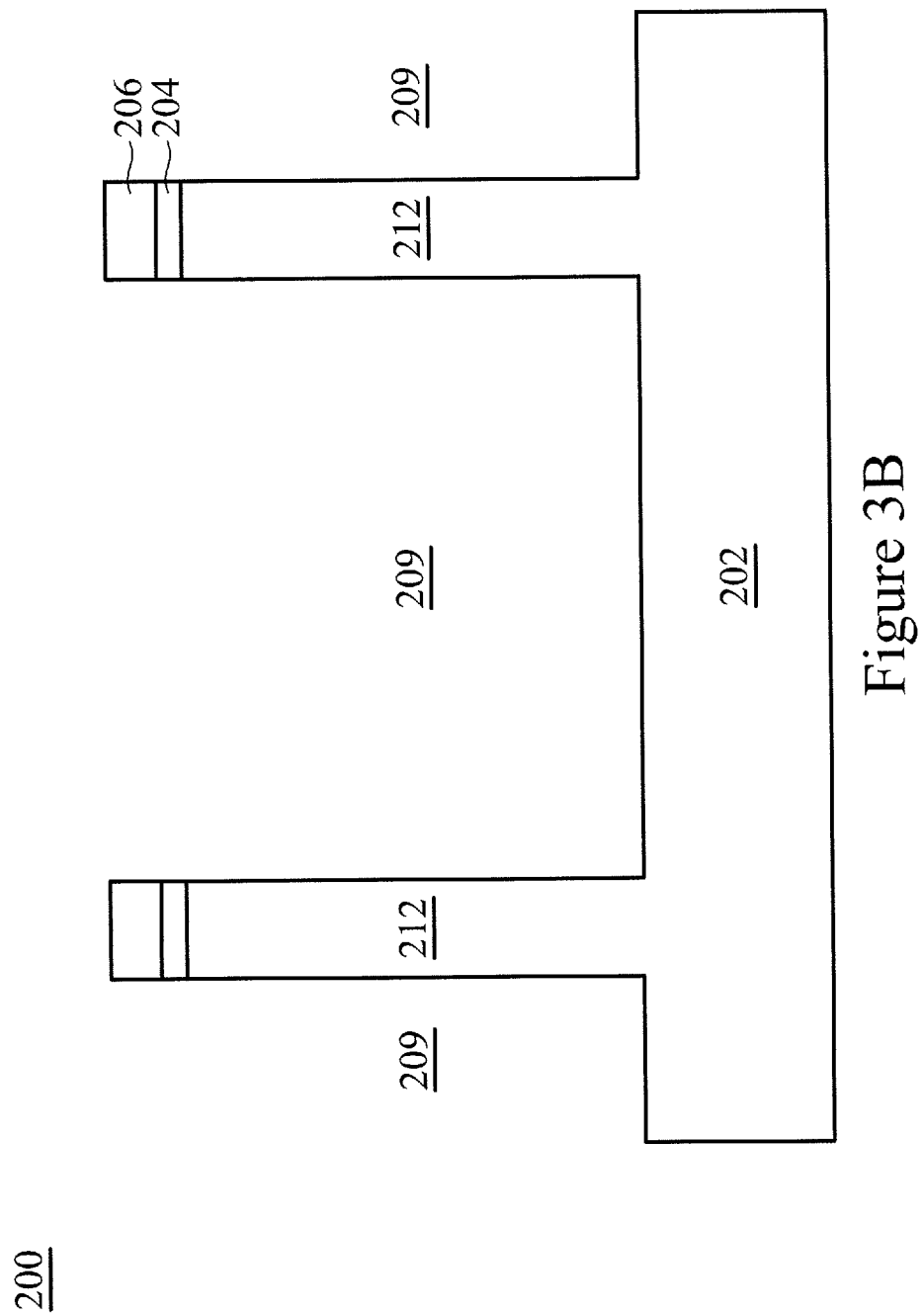

FIG. 3A is a perspective view of the FinFET 200 including the one or more fins 212 at one of the various stages of fabrication that is subsequent to FIGS. 2A and 2B according to some embodiments, and FIG. 3B is a cross-sectional view of the FinFET 200 taken along line a-a of FIG. 3A. As shown, the neighboring fins 212 are spaced by a central trench 209. It is noted that although only two fins 212 are shown in the illustrated embodiments of FIGS. 3A and 3B (and the following figures), any desired number of fins may be formed on the semiconductor substrate 202 using the photo-sensitive layer 208 (FIGS. 2A and 2B) with an according pattern. Thus, the left and right trenches 209 in FIGS. 3A and 3B may be respectively coupled between one of the shown fins 212 and another non-shown fin.

In some embodiments, the fin 212 is formed by at least some of the following processes. The mask layer 206 and pad layer 204 are etched through openings 210 (FIGS. 2A and 2B) to expose underlying semiconductor substrate 202. By using remaining pad layer 204 and the mask layer 206, as shown in FIGS. 3A and 3B, the exposed semiconductor substrate 202 is then etched to form the trenches 209 so as to cause major surfaces 202s of the semiconductor substrate 202 to be exposed. Portions of the semiconductor substrate 202 sandwiched between the trenches 209 are thus formed as the one or more fins 212. The fins 212 extending upward from the major surface 202s. The trenches 209 may be strips (viewed from the top of the FinFET 200) parallel to each other, and closely spaced with respect to each other. After the fins 212 are formed, the photo-sensitive layer 208 (not shown in FIGS. 3A and 3B for purposes of clarity) is removed. Subsequently, a cleaning process may be performed to remove a native oxide of the semiconductor substrate 202. The cleaning may be performed using diluted hydrofluoric (DHF) acid, or the like.

Figure 4A:
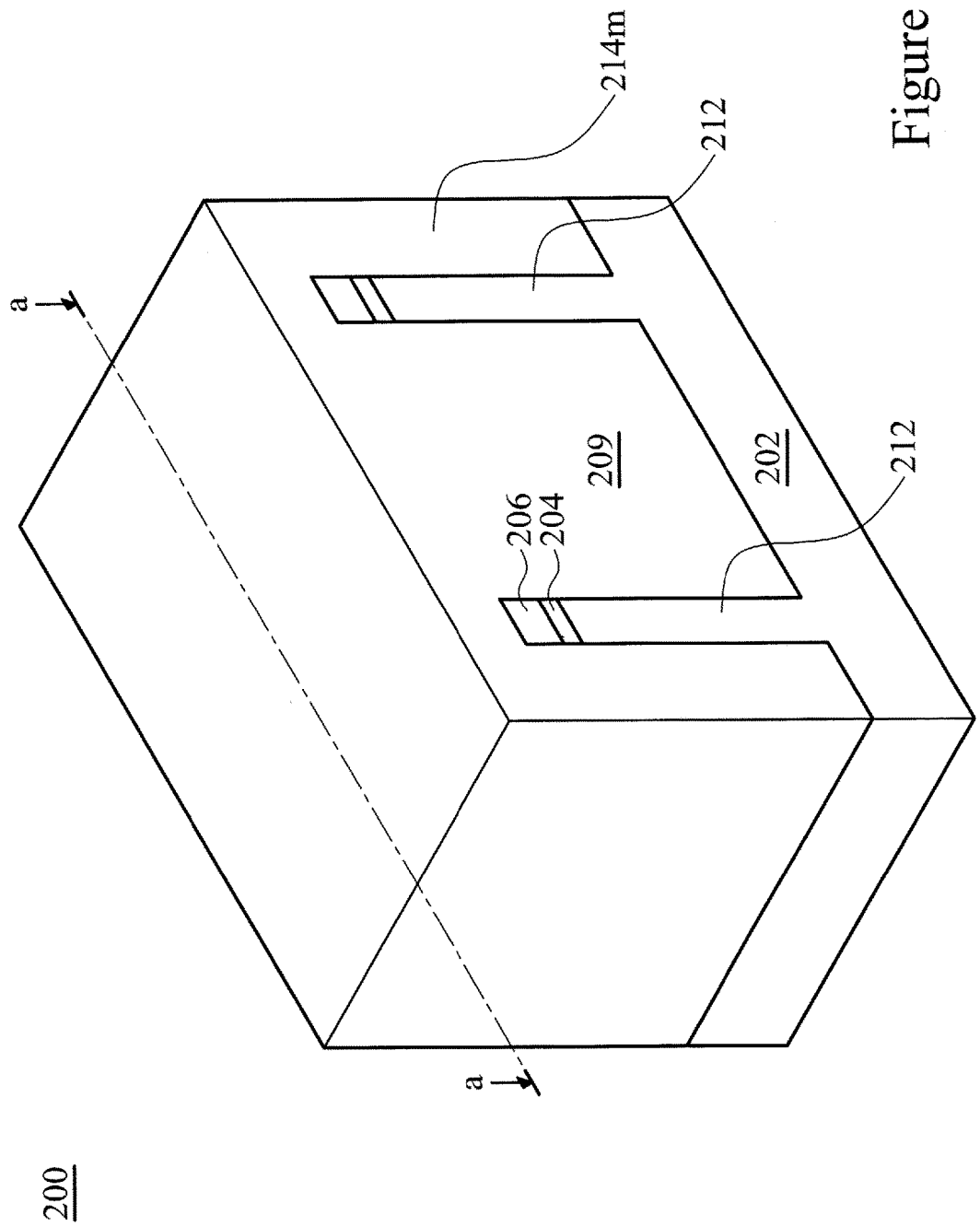
Figure 4B:
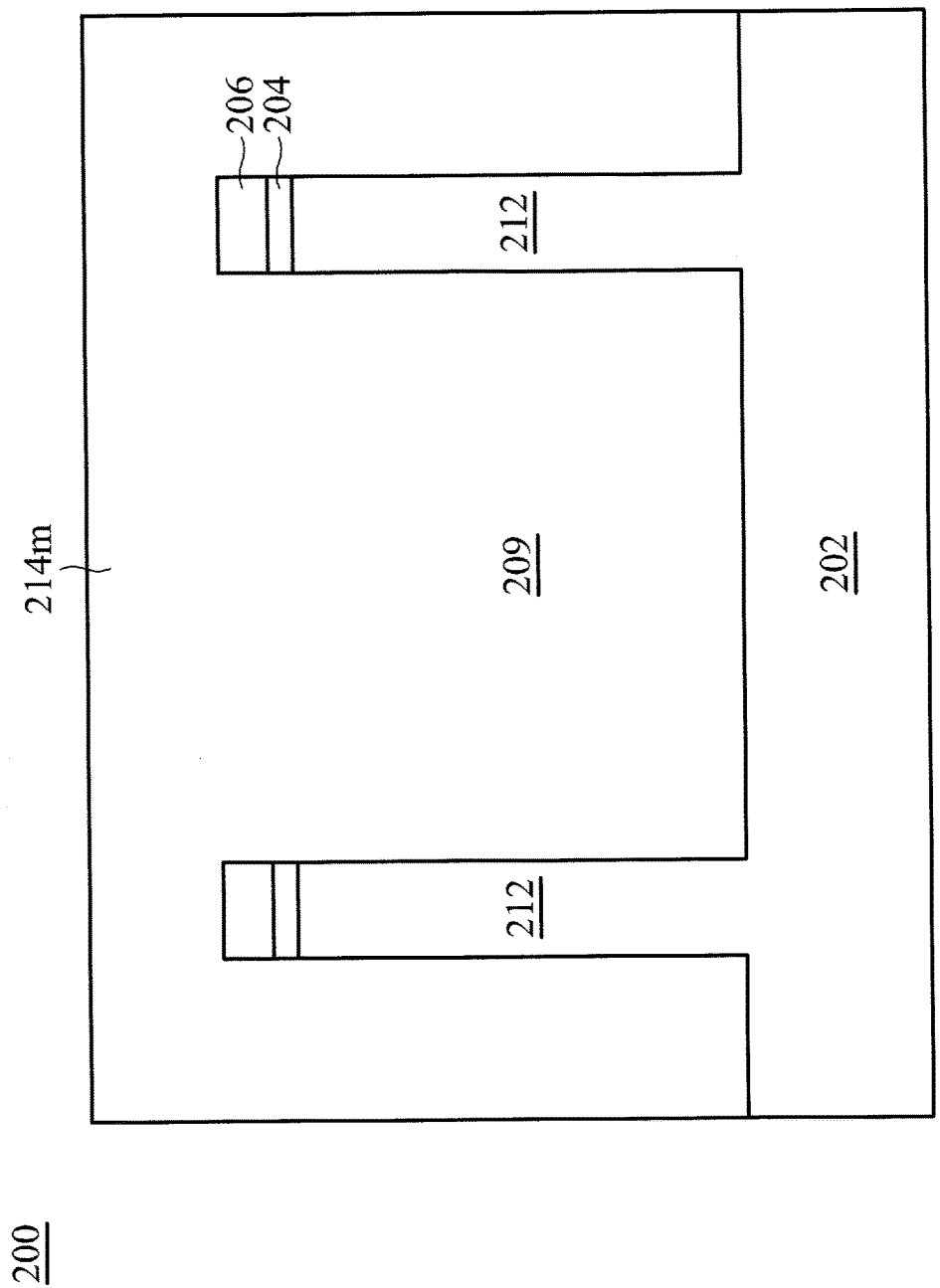

FIG. 4A is a perspective view of the FinFET 200 including the dielectric layer 214m formed over the substrate 202, the fins 202, the pad layer 204, and the mask layer 206 at one of the various stages of fabrication that is subsequent to FIGS. 3A and 3B according to some embodiments, and FIG. 4B is a cross-sectional view of the FinFET 200 taken along line a-a of FIG. 4A. As shown, the dielectric material 214m is formed over the whole FinFET 200 such that the entire trenches are filled by the dielectric material 214m.

In an embodiment, the dielectric material 214m may be deposited over the substrate 202 using a high-density-plasma (HDP) CVD process with reacting precursors, e.g., silane ($SiH_4$) and oxygen ($O_2$). In another embodiment, the dielectric material 214m may be deposited over the substrate 202 using a sub-atmospheric CVD (SACVD) process or a high aspect-ratio process (HARP), wherein process gases used in such processes may comprise tetraethylorthosilicate (TEOS) and ozone ($O_3$). In yet another embodiment, the dielectric material 214m may be deposited over the substrate 202 using a spin-on-dielectric (SOD) process such as, for example, hydrogen silsesquioxane (HSQ), methyl silsesquioxane (MSQ), or the like.

Figure 5A:
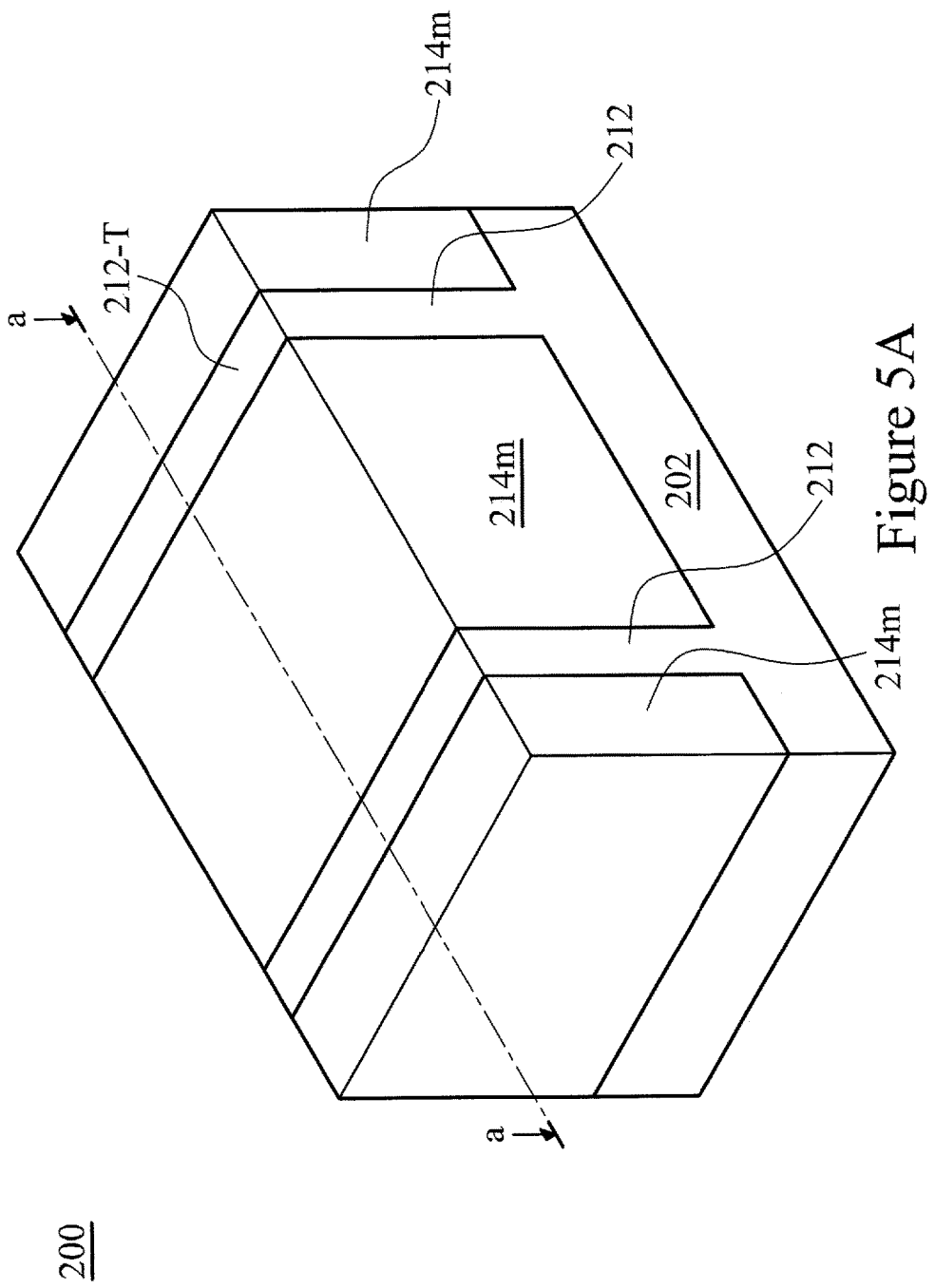
Figure 5B:
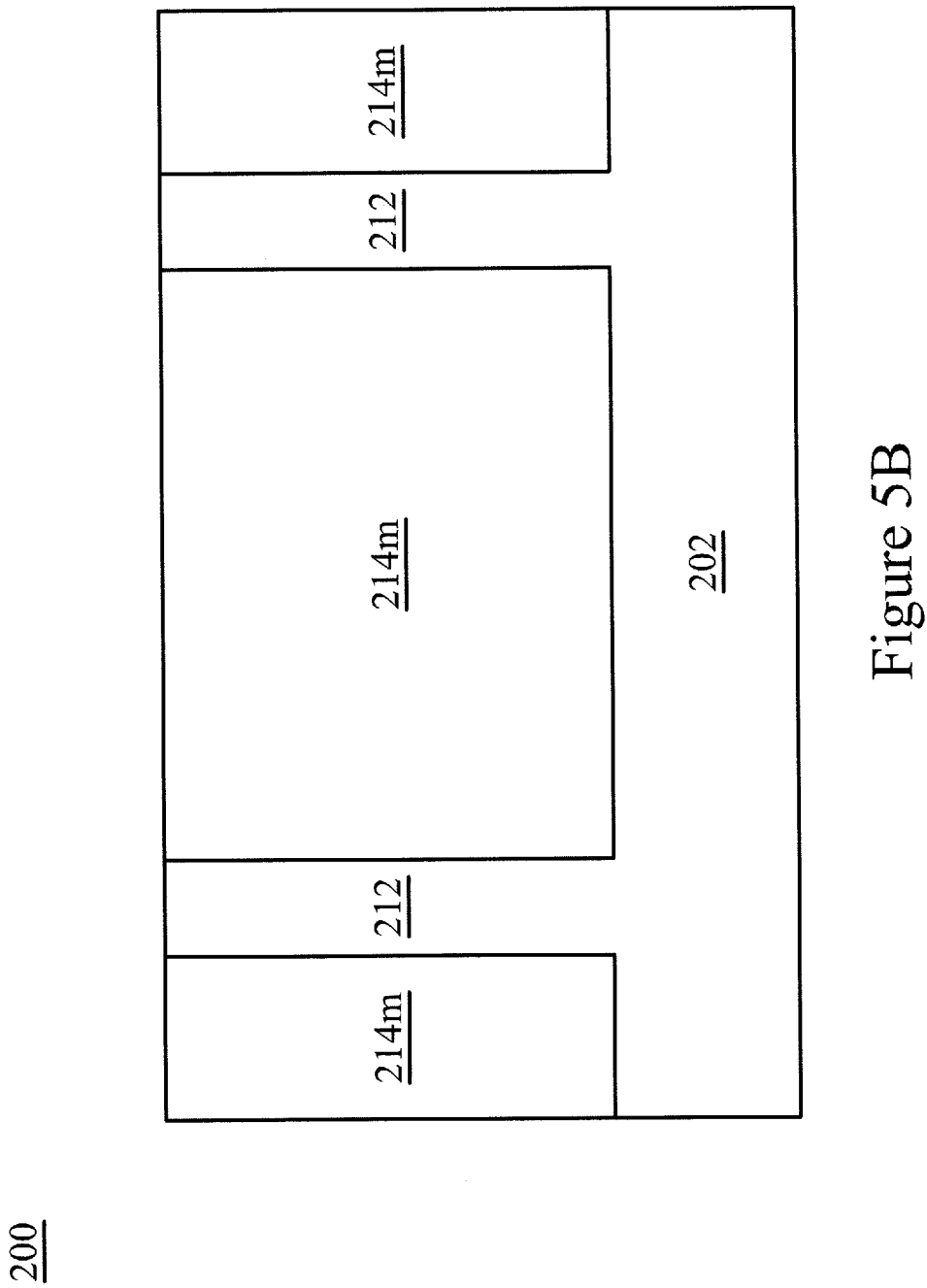

FIG. 5A is a perspective view of the FinFET 200 including the fins 212 with respective exposed top surfaces 212-T at one of the various stages of fabrication that is subsequent to FIGS. 4A and 4B according to some embodiments, and FIG. 5B is a cross-sectional view of the FinFET 200 taken along line a-a of FIG. 5A. In some embodiments, the top surfaces 212-T are exposed by performing a polishing process (e.g., a chemical-mechanical polishing process) on the dielectric material 214m (FIGS. 4A and 4B) until the mask layer 206 is again exposed. The mask layer 206 and the pad layer 204 are then removed to expose the top surface 212-T. In some embodiments, when the mask layer 206 is formed of silicon nitride, the mask layer 206 may be removed using a wet process using hot phosphoric acid ($H_3PO_4$), and when the pad layer 204 is formed of silicon oxide, the pad layer 204 may be removed using diluted hydrofluoric acid (HF). In some alternative embodiments, the removal of the mask layer 206 and the pad layer 204 may be performed after a recession process performed on the dielectric material 214m, which will be discussed in FIGS. 6A and 6B as follows.

Figure 6A:
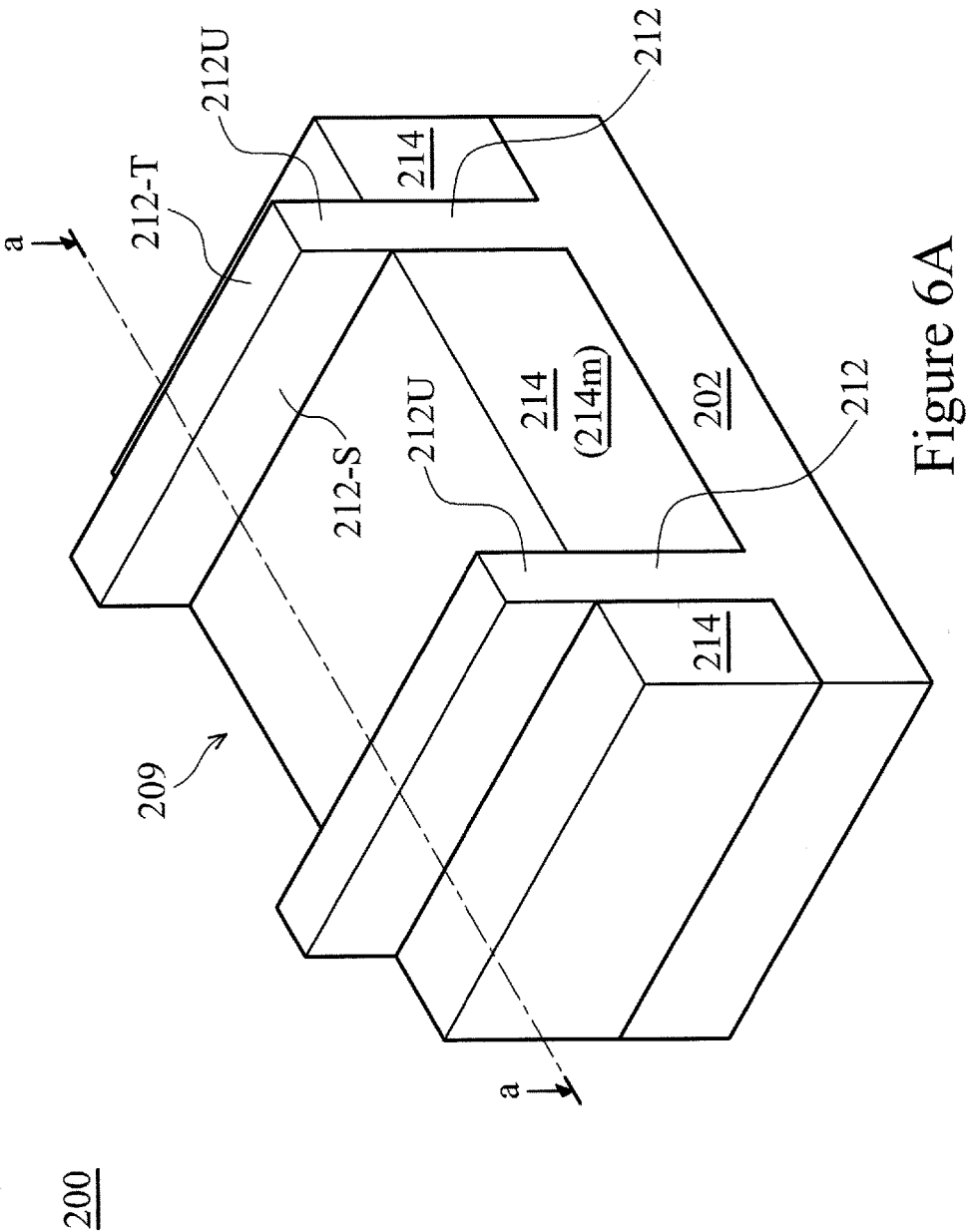
Figure 6B:
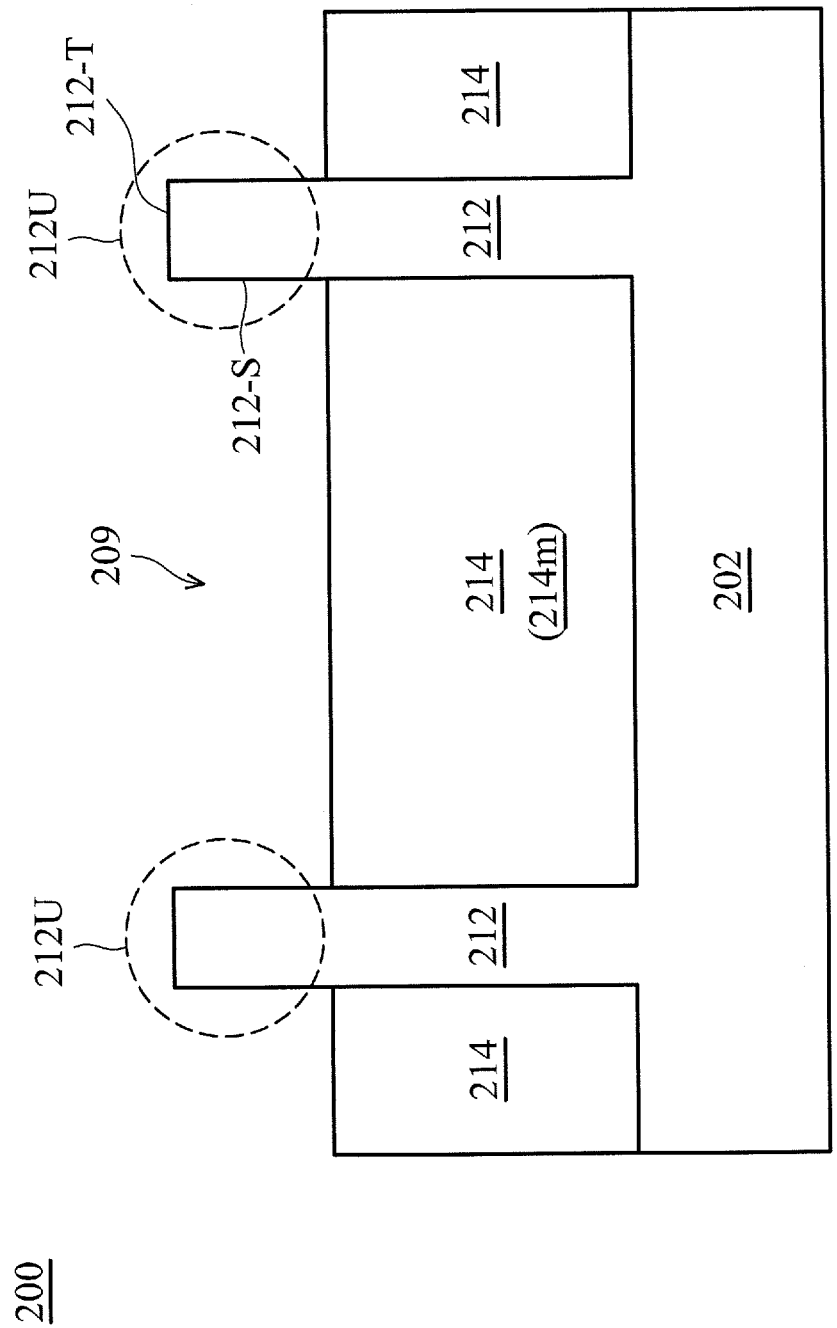

FIG. 6A is a perspective view of the FinFET 200 including an isolation features 214 sandwiched between neighboring fins 212's lower portions at one of the various stages of fabrication that is subsequent to FIGS. 5A and 5B according to some embodiments, and FIG. 6B is a cross-sectional view of the FinFET 200 taken along line a-a of FIG. 6A. As shown, after the upper fin 212U is exposed, sidewalls 212-S of the upper fin 212U are exposed together with the top surface 212-T.

In some embodiments, the top surface 212-T and the sidewalls 212-S have respective different crystal orientations. It is understood by people of ordinary skill in the art that a crystalline semiconductor material (e.g., silicon) includes a plurality of atoms that are arranged as a three-dimensional structure, and such a three-dimensional structure incudes a plurality of planes that each has a respective crystal orientation. Generally, the crystal orientation is denoted by a Miller index, e.g., <001>. In a non-limiting example in which the upper fin 212U includes silicon, the crystal orientations of the top surface 212-T and the sidewalls 212-S may be <100> and <110>, respectively. The top surface 212-T and the sidewalls 212-S may have other crystal orientations, respectively, while remaining within the scope of the present disclosure. For example, the crystal orientations of the top surface 212-T and the sidewalls 212-S may be <111> and <110>, respectively; the crystal orientations of the top surface 212-T and the sidewalls 212-S may be <110> and <100>, respectively; and the crystal orientations of the top surface 212-T and the sidewalls 212-S may be <110> and <111>, respectively.

For clarity, a silicon surface having the <100> crystal orientation is herein referred to as a "(100) silicon plane," a surface having the <110> crystal orientation is herein referred to as a "(110) silicon plane," and a surface having the <111> crystal orientation is herein referred to as a "(111) silicon plane" in the following discussions. For example, the top surface 212-T includes the (100) silicon plane, and each sidewall 212-S includes the (110) silicon plane. It is noted that in some other examples in which the upper fin 212U includes a material other than silicon, e.g., germanium, the top surface and sidewalls of such a germanium upper fin may have respective crystal orientations different from the <100> and <110> crystal orientations.

In some embodiments, the isolation feature 214 may be formed by performing at least one etching process to recess an upper portion of the dielectric material 214m. In an embodiment, the etching process may include performing a wet etching process such as, for example, dipping the substrate 202 in a hydrofluoric acid (HF) solution to recess the upper portion of the dielectric material 214m until the upper fin 212U is exposed. In another embodiment, the etching process may include performing a dry etching process such as, for example, using etching gases fluoroform ($CHF_3$) and/or boron trifluoride ($BF_3$) to recess the upper portion of the dielectric material 214m until the upper fin 212U is exposed.

Figure 7A:
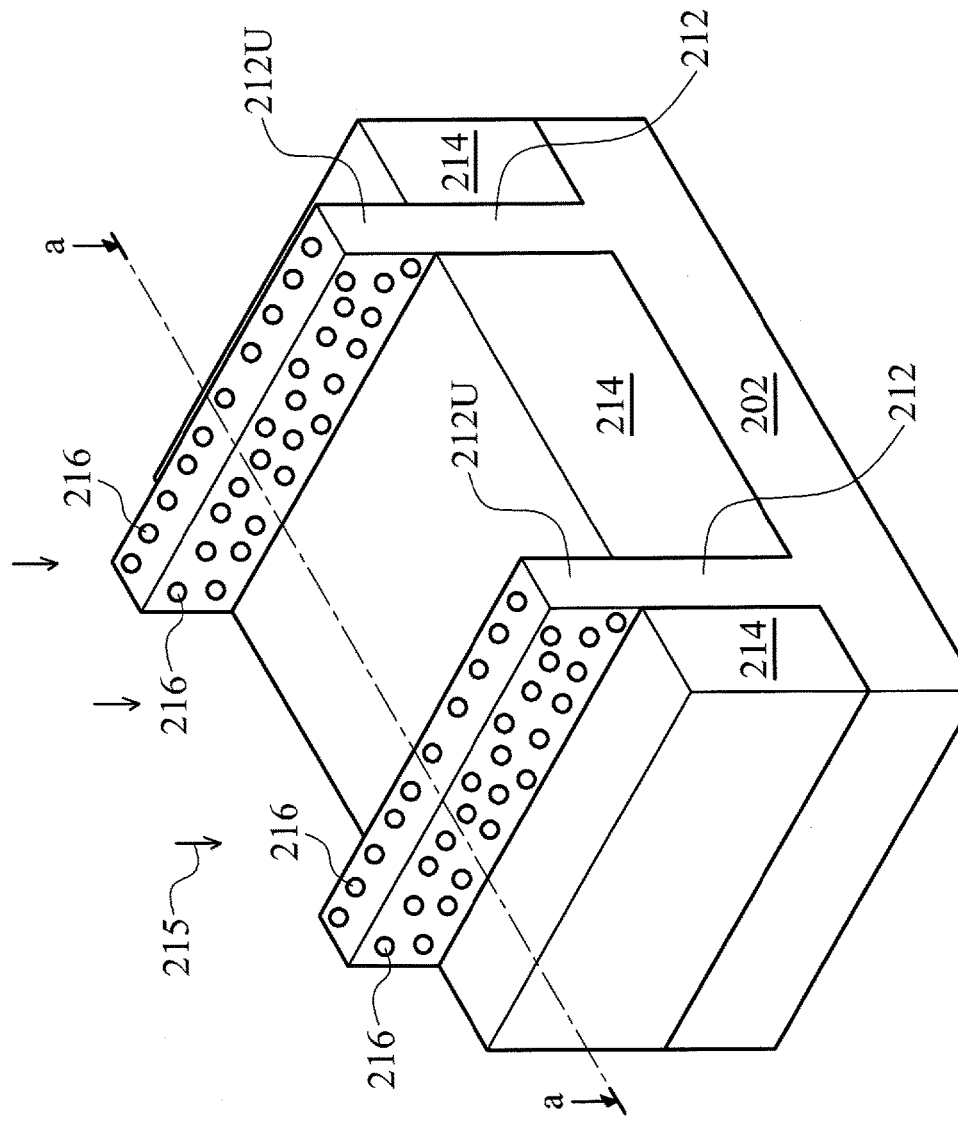
Figure 7B:
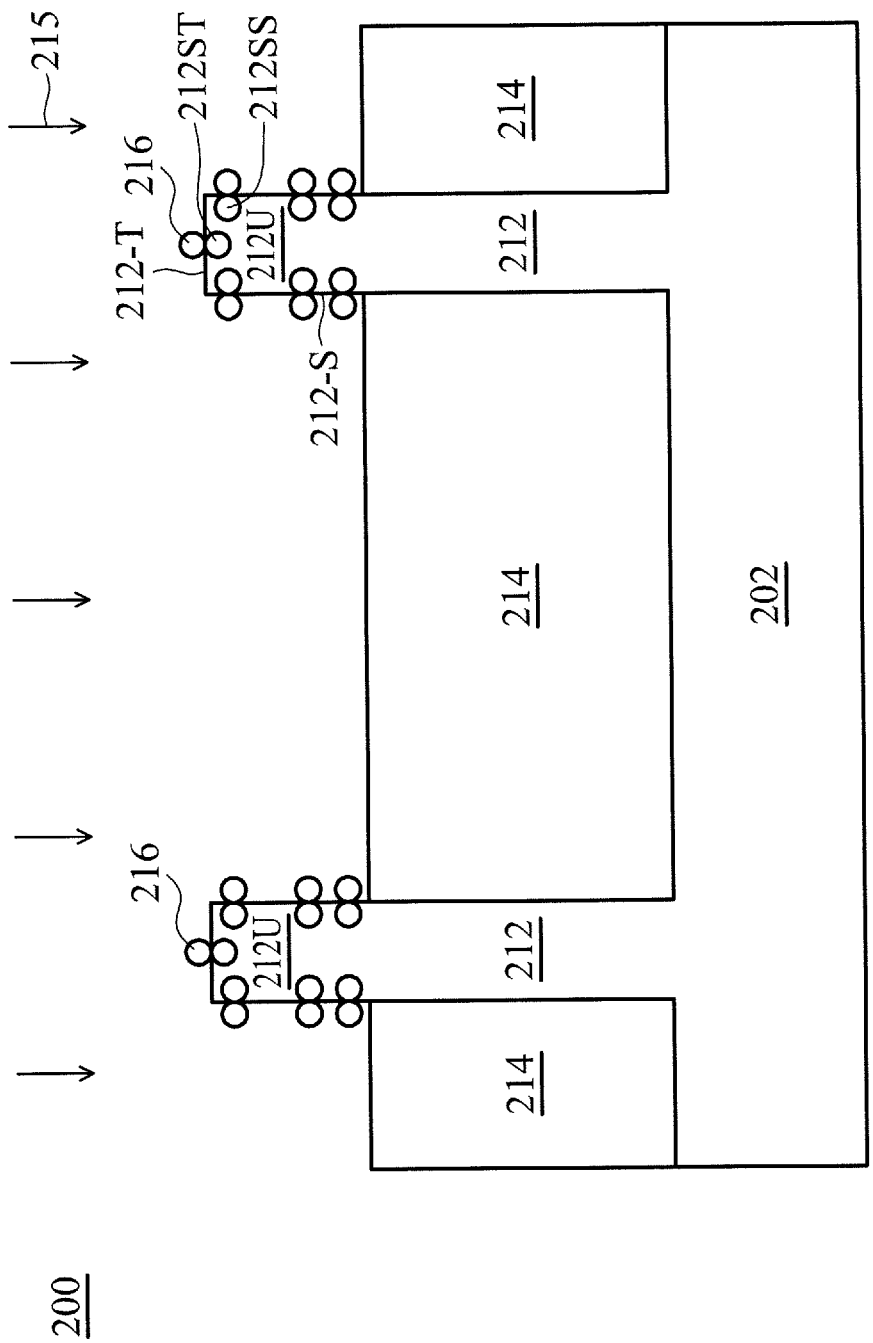

FIG. 7A is a perspective view of the FinFET 200 including the upper fin 212U overlaid by the nitrogen-based radicals 216 at one of the various stages of fabrication that is subsequent to FIGS. 6A and 6B according to some embodiments, and FIG. 7B is a cross-sectional view of the FinFET 200 taken along line a-a of FIG. 7A. In some embodiments, each of the nitrogen-based radicals 216 may be attached to one or more atoms (e.g., silicon atoms) along the top surface 212-T and the sidewall 212-S of the upper fin 212U (e.g., 212SS, 212ST, etc.) thereby forming silicon-nitrogen radical bond(s).

As mentioned above, the top surface 212-T and the sidewall 212-S of the upper fin 212U each has a respective different crystal orientation. It is understood by people of ordinary skill in the art that the different crystal orientations of a silicon crystal result in different surface densities of silicon atoms. For example, the (100) silicon plane (e.g., the top surface 212-T) has a silicon atom surface density of about $6.8 \times 10^{14}$ (atoms/$cm^{-3}$), the (110) silicon plane (e.g., the sidewall 212-S) has a silicon atom surface density of about $9.6 \times 10^{14}$ (atoms/$cm^{-3}$), and the (111) silicon plane has a silicon atom surface density of about $7.8 \times 10^{14}$ (atoms/$cm^{-3}$). Because of the different silicon surface densities, the top surface 212-T and the sidewall 212-S may be overlaid by the nitrogen-based radicals 216 in respective different concentrations. Alternatively stated, the silicon-nitrogen radical bonds may be distributed along the top surface 212-T and the sidewall 212-S in respective different concentrations.

In some embodiments, the concentration of the nitrogen-based radicals overlaying a particular surface/sidewall is positively proportional to the silicon atom surface density of the crystal orientation of that particular surface/sidewall. Continuing with above example in which the top surface 212-T includes the (100) plane (i.e., having the <100> crystal orientation) and the sidewall 212-S includes the (110) plane (i.e., having <110> crystal orientation), the nitrogen-based radicals 216 may be distributed along the sidewall 212-S relatively densely, and the nitrogen-based radicals 216 may be distributed over the top surface 212-T relatively sparsely since the silicon atom surface density of the (110) plane is larger than that of the (100) plane. In another example in which the top surface 212-T includes the (111) plane (i.e., having the <111> crystal orientation) and the sidewall 212-S includes the (110) plane (i.e., having the <110> crystal orientation), the nitrogen-based radicals 216 may be distributed along the sidewall 212-S relatively densely, and the nitrogen-based radicals 216 may be distributed over the top surface 212-T relatively sparsely since the silicon atom surface density of the (110) plane is larger than that of the (111) plane. Yet in another example in which the top surface 212-T includes the (110) plane (i.e., having the <110> crystal orientation) and the sidewall 212-S includes the (111) plane (i.e., having the <111> crystal orientation), the nitrogen-based radicals 216 may be distributed along the sidewall 212-S relatively sparsely, and the nitrogen-based radicals 216 may be distributed over the top surface 212-T relatively densely since again the silicon atom surface density of the (110) plane is larger than that of the (111) plane.

In some embodiments, the nitrogen-based radicals 216 overlaying the upper fin 212U may be effectively formed as a barrier layer to protect at least part of the surface silicon atoms along the sidewalls 212-S and the top surface 212-T, for example, silicon atoms 212SS along the sidewall 212-S and silicon atoms 212ST along the top surface 212-T. Such nitrogen-based radicals 216 may suppress one or more precursors (e.g., $O_2$ or oxygen atoms), which are provided in a later thermal oxidation process, to react with silicon atoms that are not bonded to the nitrogen-based radicals 216 in the upper fin 212U (e.g., the silicon atoms in the upper fin 212U other than 212SS and 212ST). Moreover, the difference between the concentrations of the nitrogen-based radicals 216 over the top surface 212-T and along the sidewall 212-S may provide an offset of respective amounts of the oxygen atoms to react with the silicon atoms (e.g., silicon atoms non-bonded or partially bonded to the nitrogen-based radicals 216) along the top surface 212-T and the sidewall 212-S. As such, a conformal oxide layer may in turn be formed over the upper fin 212U in the later thermal oxidation process. Details of the formation of such a conformal oxide layer will be discussed further below.

In some embodiments, the treatment process 215 may include using a plasma-based source to decompose a nitrogen-based gas (e.g., $NH_3$) thereby forming the nitrogen-based radicals 216, and flowing the nitrogen-based radicals 216 over the substrate 202 under a temperature of about 600° C. to 1000° C. for about 5 seconds to 10 minutes. More specifically, in some embodiments, the nitrogen-based radicals 216 may have a concentration of about 2%~20%.

Figure 8A:
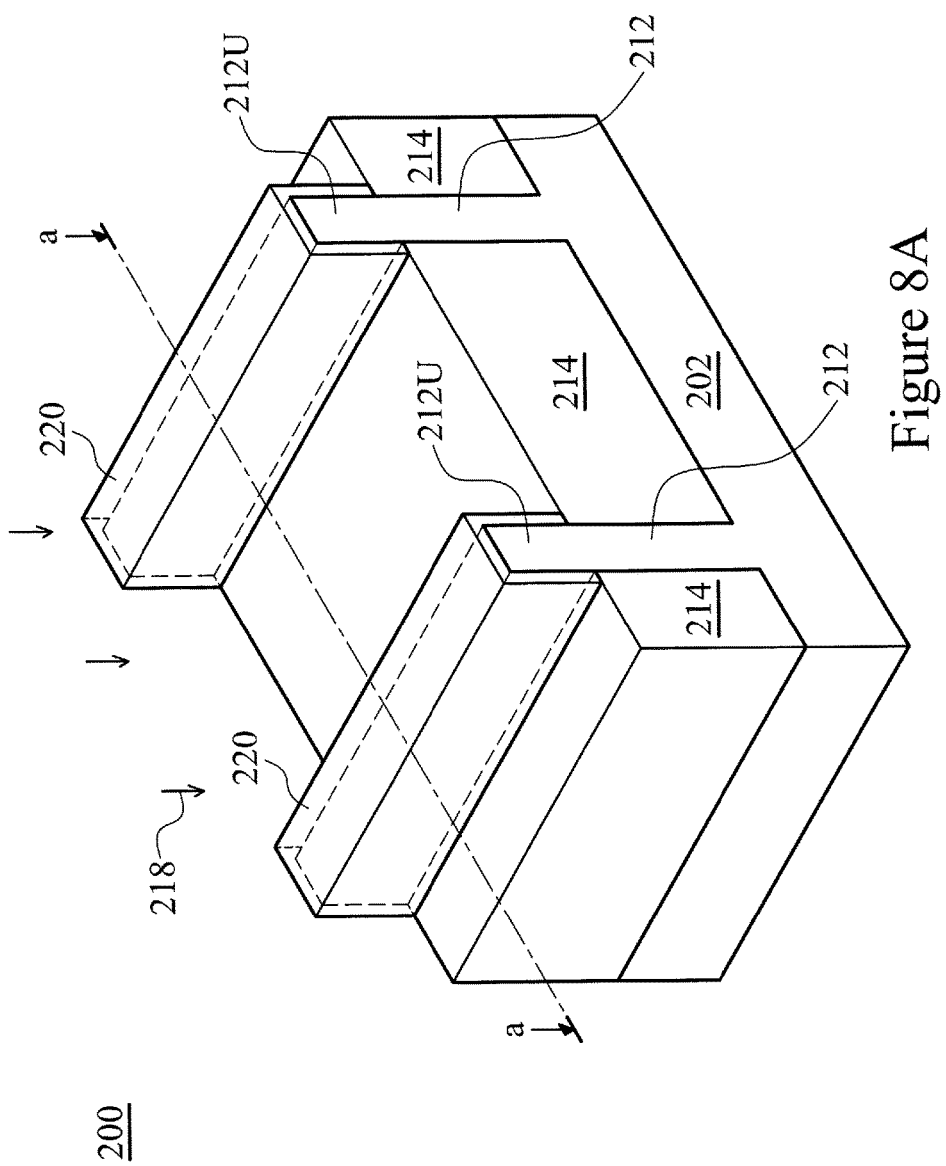
Figure 8B:
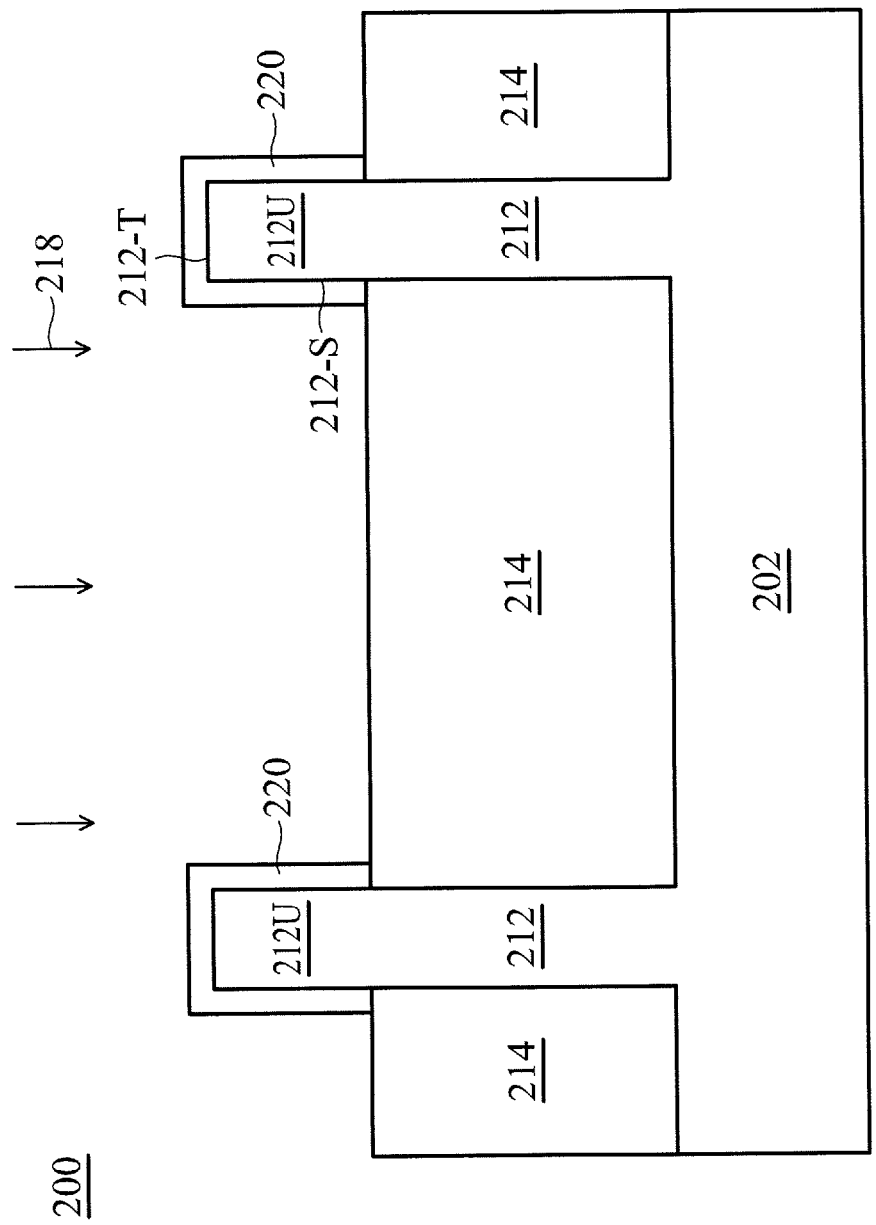
Figure 9:
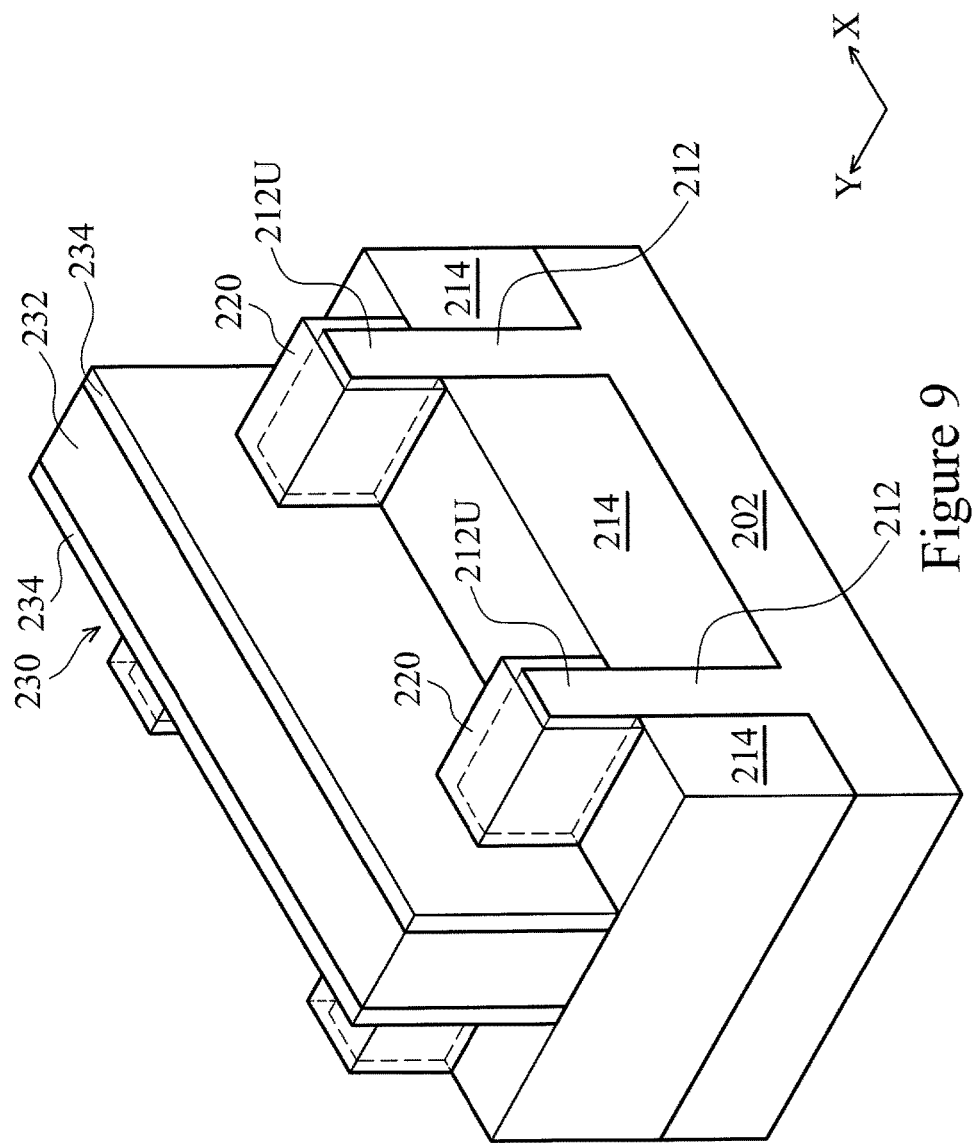
Figure 10:
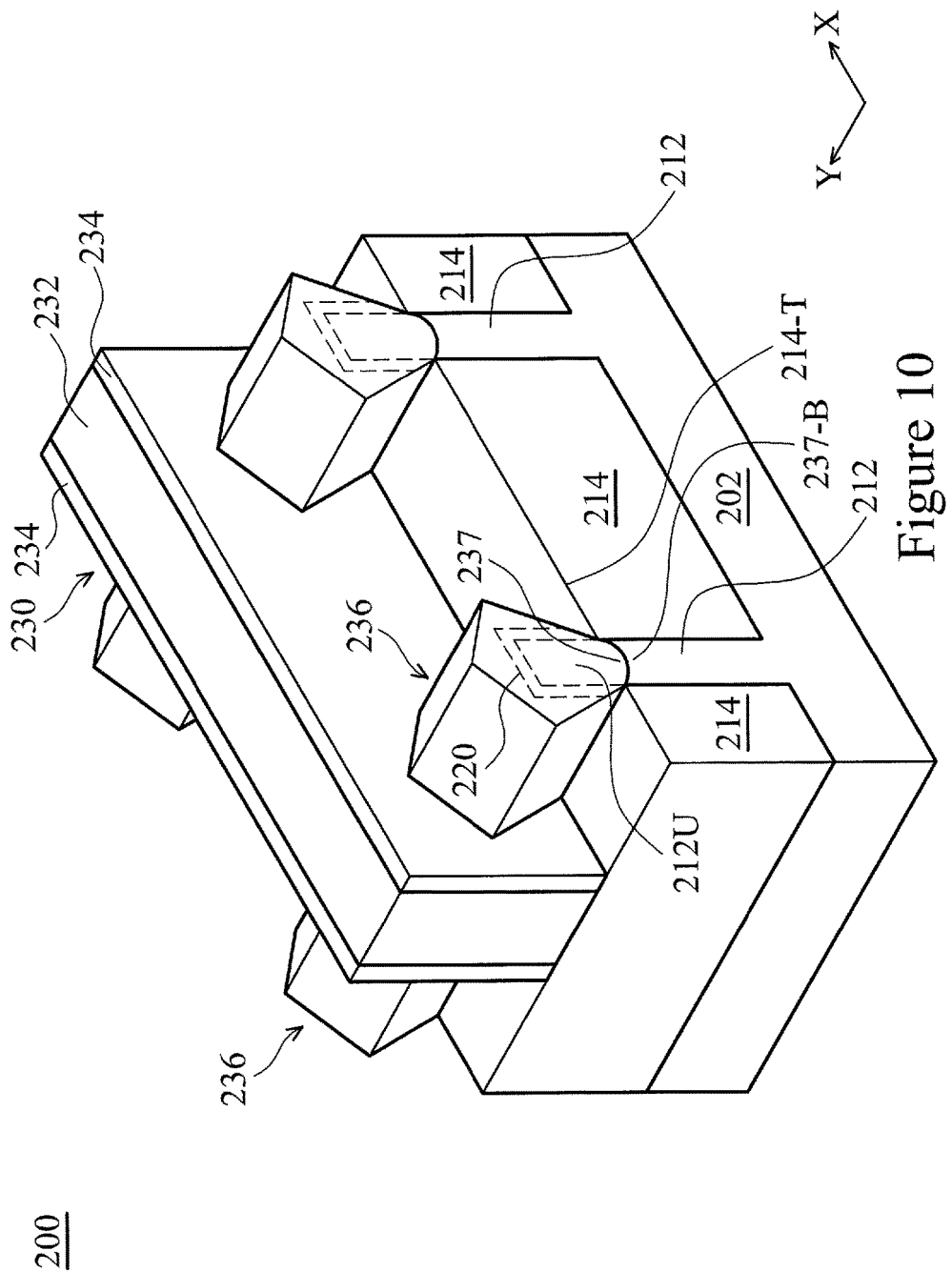

FIG. 8A is a perspective view of the FinFET 200 including the oxide layer 220 along the sidewalls 212-S and over the top surface 212-T that has a substantially conformal thickness at one of the various stages of fabrication that is subsequent to FIGS. 7A and 7B according to some embodiments, and FIG. 8B is a cross-sectional view of the FinFET 200 taken along line a-a of FIG. 8A. For clarity, the overlaid upper fin 212U is shown in dotted lines in FIG. 8A and the following figures in the perspective view (FIGS. 9 and 10).

In some embodiments, the thermal oxidation process 218 includes placing the FinFET 200 under a substantially high temperature (about 800° C. to 1200° C.), and providing oxygen atoms (decomposed from $H_2O$, $O_2$, etc.) to cause the oxygen atoms to react with the above-mentioned active silicon atoms along the top surface 212-T and the sidewalls 212-S. More specifically, in some embodiments, after the thermal oxidation process 218, the oxide layer 220 may include silicon oxynitride (SiON). The oxide layer 220 may have a conformal thickness of about 2~3 angstroms (Å).

Conventionally, without forming the nitrogen-based radicals 216 over the upper fin 212U, a conformal oxide layer is difficult to be formed by using the thermal oxidation process since the oxygen atoms tend to form an oxide layer (e.g., $SiO_2$) more quickly on the silicon surface that has a particular crystal orientation, i.e., a higher silicon oxide growth rate in that particular crystal orientation. For example, under an identical condition (e.g., temperature, pressure, time, etc.) of a thermal oxidation process, an $SiO_2$ layer formed on the (110) silicon plane may be thicker than an $SiO_2$ layer formed on the (100) silicon plane. Continuing with the above example in which the top surface 212-T includes the (100) silicon plane and the sidewalls 212-S include the (110) silicon plane, the $SiO_2$ layer along the sidewall 212-S may be thicker than the $SiO_2$ layer over the top surface 212-T. Such a thicker $SiO_2$ layer along the sidewall may result in a higher consumption of the silicon atoms along the sidewall, which in turn may cause a variety of issues such as, for example, formation of a conduction leakage path.

In stark contrast, the present disclosure provides the method 100 to bond the nitrogen-based radicals 216 to the surface silicon atoms along the top surface 212-T and the sidewalls 212-S (e.g., 212SS and 212ST in FIGS. 7A and 7B) in respective different concentrations. For example, the nitrogen-based radicals 216 may be distributed along the sidewall 212-S relatively densely, and the nitrogen-based radicals 216 may be distributed over the top surface 212-T relatively sparsely. As such, the amount of oxygen atoms (provided in the thermal oxidation process 218) that will react with the silicon atoms along the sidewall 212-S (e.g., the (100) silicon plane) is suppressed more, and the amount of oxygen atoms that will react with the silicon atoms along the top surface 212-T (e.g., the (110) silicon plane) is suppressed less. The issue of the oxide layer that is used to be formed thicker on the (110) silicon plane (e.g., the sidewall 212-S) may be advantageously avoided. Accordingly, the oxide layer 220 may be formed with a substantially conformal thickness.

FIG. 9 is a perspective view of the FinFET 200 including the gate stack 230 extending along the X direction so as to overlay the one or more upper fins 212U, and the Y direction so as to overlay the respective central portions of the upper fins 212U at one of the various stages of fabrication that is subsequent to FIGS. 8A and 8B according to some embodiments. In some embodiments, the central portion of the overlaid upper fin 212U may serve as a conduction channel (along the Y direction) of the FinFET 200, and the central portion of the oxide layer 220 disposed between such a conduction channel and the gate stack 230 may serve as a gate dielectric layer of the FinFET 200.

The gate stack 230 includes a gate electrode 232 and spacer layers 234 extending along sidewalls of the gate electrode 232. In some embodiments, the gate electrode 232 may comprise a single layer or multilayer structure. In some embodiments, the gate electrode 232 may comprise a polysilicon material. Further, the gate electrode 232 may be a polysilicon material doped with a uniform or non-uniform doping concentration. In some alternative embodiments, the gate electrode 232 may include a metal material such as, for example, Al, Cu, W, Ti, Ta, TiN, TiAl, TiAlN, TaN, NiSi, CoSi, or combinations thereof. The gate electrode 232 may be formed using a suitable process such as ALD, CVD, PVD, plating, or combinations thereof.

In some embodiments, the spacer layer 234 may include silicon oxide, silicon nitride, silicon oxynitride, or other suitable material. The spacer layer 234 may comprise a single layer or multilayer structure. In some embodiments, the spacer layer 234 may be formed by depositing a blanket layer of the dielectric layer 234 by CVD, PVD, ALD, or other suitable technique, and performing an anisotropic etching process on the blanket dielectric layer 234 to form the pair of the spacer layer 234 along the sidewalls of the gate electrode 232, as shown in the illustrated embodiment of FIG. 9.

In some alternative embodiments, the gate electrode 232 that includes the polysilicon material may serve as a dummy gate electrode. More specifically, after forming the gate electrode 232 and the spacer layer 234, the dummy gate electrode 232 may be subsequently removed by one or more selective dry and/or wet etching processes so as to expose the central portion of the oxide layer 220 that was covered by the dummy gate electrode 232 and leave the spacer layer 234 intact. The exposed central portion of the oxide layer 220 is then removed by one or more other selective dry and/or wet etching processes to expose the central portion of the upper fin 212U that was covered by the dummy gate electrode 232. Subsequently, a high-k dielectric material is deposited to overlay the exposed central portion of the upper fin 212U by CVD, PVD, ALD, or the like. And a new gate electrode is deposited over the high-k dielectric material by CVD, PVD, ALD, or the like. In some embodiments, the high-k dielectric material includes oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The new gate electrode may be formed of at least one of the above-described polysilicon, and metal materials (e.g., Al, Cu, W, Ti, Ta, TiN, TiAl, TiAlN, TaN, NiSi, CoSi, or a combination thereof).

FIG. 10 is a perspective view of the FinFET 200 including the source/drain features 236 formed on side portions of the oxide layer 220 that are covered by the gate stack 230 (FIG. 9) at one of the various stages of fabrication that is subsequent to FIG. 9 according to some embodiments. In some embodiments, the side portions of the oxide layer 220, and the side portions of at least part of the upper fin 212U are removed before the formation of the source/drain features 236, so that the side portions of the oxide layer 220 and the upper fin 212U are shown in dotted lines, respectively, in FIG. 10. The formation of the source/drain feature 236 will be briefly described as follows.

In some embodiments, the side portions of the oxide layer 220 that are not covered by the gate stack 230 are removed by one or more selective wet/dry etching processes, and the side portions of the upper fin 212U are removed by one or more other selective wet/dry etching processes so as to form respective recesses 237 on the sides of the gate stack 230. In some embodiments, each recess 237 has a bottom surface 237-B. Such a recess 237 may be extended downwardly beneath a top surface 214-T of the isolation feature 214, i.e., the bottom surface 237-B is vertically lower than the top surface 214-T. Subsequently, the source/drain features 236 are epitaxially grown from the fin 212 by using a low-pressure chemical vapor deposition (LPCVD) process and/or a metal-organic chemical vapor deposition (MOCVD) process.

Figure 11:
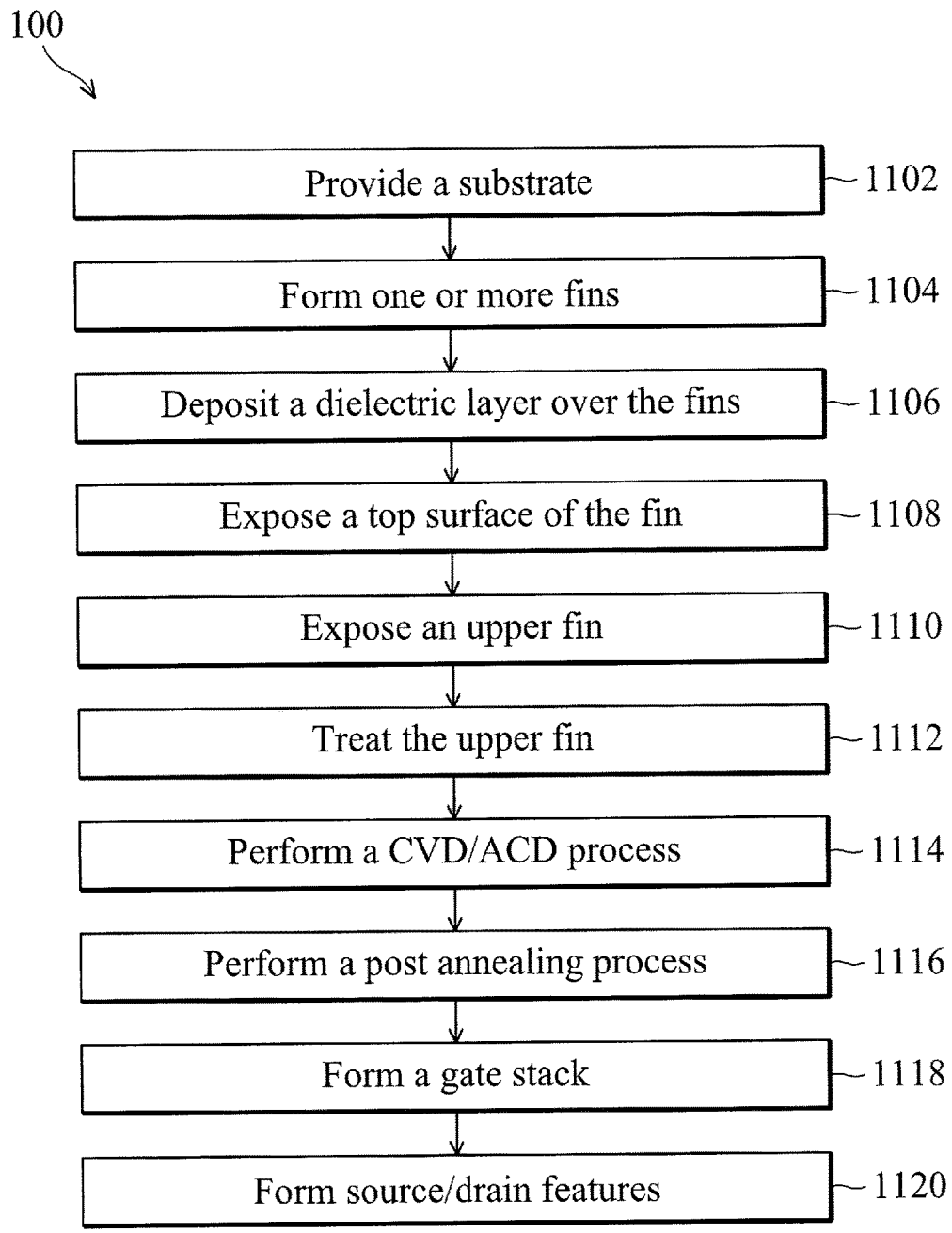
FIG. 11 illustrates a flow chart of another embodiment of the method of FIG. 1 to form the semiconductor device, in accordance with some embodiments.

FIG. 11 illustrates a flowchart of another method 1100 to form a FinFET according to one or more embodiments of the present disclosure. The method 1100 is substantially similar to the method 100 except that the method 1100 uses the CVD/ALD techniques in operation 1114 to form an oxide layer (compared to the thermal oxidation process 114 of the method 100 in FIG. 1), which is followed by a post annealing process in operation 1116. More specifically, operations 1102, 1104, 1106, 1108, 1108, 1110, and 1112 of the method 1100 are substantially similar to the operations 102, 104, 106, 108, 110, and 112 of the method 100 in FIG. 1, respectively. Thus, the following discussion of the method 1100 will be focused on describing operations 1114 and 1116.

In some embodiments, the operation 1114 includes using the CVD/ALD techniques to deposit an oxide layer over a treated upper fin. Different from the thermal oxidation process, such CVD/ALD techniques generally uses silicon-based precursors with $H_2O$ as oxidants to form the oxide layer in layer-by-layer fashion. Since the oxide layer is formed by using silicon atoms provided by the silicon-based precursors during the CVD/ALD process, the silicon atoms in the upper fin can remain substantially intact (i.e., a minimum amount of silicon loss in the upper fin). And the oxide layer formed by the CVD/ALD techniques typically has a conformal thickness over the upper fin. In some embodiments, the operation 1116 includes performing a post annealing process to cure the oxide layer. In some embodiments, the post annealing process includes flowing oxygen ($O_2$) over the oxide layer under a temperature of about 800° C. to about 1100° C. for a spike of about 1 milliseconds to about 5 minutes. Since the upper fin is covered by nitrogen-based radicals (i.e., the treatment process in the operations 112/1112), the oxygen flown in the post annealing process may be blocked by the nitrogen-based radicals from diffusing into the upper fin thereby avoiding silicon loss in the upper fin.

In an embodiment, a method for forming a fin-based transistor includes forming a fin on a substrate; overlaying at least an upper portion of the fin with nitrogen-based radicals; and forming an oxide layer over the upper portion of the fin using a thermal oxidation process.

In another embodiment, a method for forming a fin-based transistor includes forming a fin on a substrate; exposing an upper portion of the fin, wherein the upper portion of the fin comprises a top surface having a first silicon crystal plane and a sidewall having a second silicon crystal plane, the first and second silicon crystal planes having respective different silicon atom surface densities; overlaying the top surface and the sidewall of the upper fin with nitrogen-based radicals in respective different concentrations; and using a thermal oxidation process to form an oxide layer over the upper portion of the fin.

Yet in another embodiment, a method for forming a fin-based transistor includes forming a fin on a substrate; overlaying at least an upper portion of the fin with nitrogen-based radicals; forming an oxide layer over the upper portion of the fin using an atomic layer deposition (ALD) process; and performing a post annealing process on the oxide layer.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a fin-based transistor, comprising:
    forming a fin on a substrate;
    overlaying at least an upper portion of the fin with nitrogen-based radicals at different concentrations; and
    forming an oxide layer over the upper portion of the fin using a thermal oxidation process.

2. The method of claim 1, wherein the oxide layer has a substantially conformal thickness.

3. The method of claim 1, wherein the upper portion comprises a top surface and a sidewall of the upper portion of the fin, and wherein the top surface comprises a (100) silicon crystal plane, and the sidewall comprises a (110) silicon crystal plane.

4. The method of claim 3, wherein the nitrogen-based radicals overlaying the sidewall are more densely than the nitrogen-based radicals overlaying the top surface.

5. The method of claim 1, wherein the nitrogen-based radicals are distributed along a sidewall and over a top surface of the upper portion of the fin with the different concentrations, respectively.

6. The method of claim 1, furthering comprising:
    forming one or more isolation features overlaying a lower portion of the fin.

7. The method of claim 1, further comprising:
    forming a gate stack overlaying respective central portions of the oxide layer and the fin, wherein the oxide layer serves as a gate dielectric layer of the fin-based transistor;
    removing side portions of the oxide layer that are not overlaid by the gate stack;
    recessing side portions of the fin that are not overlaid by the gate stack; and
    forming source and drain features in the recessed side portions of the fin.

8. A method for forming a fin-based transistor, comprising:
    forming a fin on a substrate;
    exposing an upper portion of the fin, wherein the upper portion of the fin comprises a top surface having a first silicon crystal plane and a sidewall having a second silicon crystal plane, the first and second silicon crystal planes having respective different silicon atom surface densities;
    overlaying the top surface and the sidewall of the upper portion of the fin with nitrogen-based radicals in respective different concentrations; and
    using a thermal oxidation process to form an oxide layer over the upper portion of the fin.

9. The method of claim 8, wherein the oxide layer has a substantially conformal thickness.

10. The method of claim 8, wherein the top surface comprises a (100) silicon crystal plane, and the sidewall comprises a (110) silicon crystal plane.

11. The method of claim 10, wherein the nitrogen-based radicals overlaying the sidewall are more densely than the nitrogen-based radicals overlaying the top surface.

12. The method of claim 8, wherein the exposing the upper portion of the fin furthering comprises:
    forming one or more isolation features overlaying a lower portion of the fin.

13. The method of claim 8, further comprising:
    forming a gate stack overlaying respective central portions of the oxide layer and the fin, wherein the oxide layer serves as a gate dielectric layer of the fin-based transistor;
    removing side portions of the oxide layer that are not overlaid by the gate stack;
    recessing side portions of the fin that are not overlaid by the gate stack; and
    forming source and drain features in the recessed side portions of the fin.

14. A method for forming a fin-based transistor, comprising:
    forming a fin on a substrate;
    overlaying at least an upper portion of the fin with nitrogen-based radicals at different concentrations;
    forming an oxide layer over the upper portion of the fin using an atomic layer deposition (ALD) process; and
    performing a post annealing process on the oxide layer.

15. The method of claim 14, wherein the upper portion comprises a top surface and a sidewall of the upper portion of the fin, and wherein the top surface comprises a (100) silicon crystal plane, and the sidewall comprises a (110) silicon crystal plane.

16. The method of claim 15, wherein the nitrogen-based radicals overlaying the sidewall are more densely than the nitrogen-based radicals overlaying the top surface.

17. The method of claim 14, wherein the nitrogen-based radicals are distributed along a sidewall and over a top surface of the fin with the different concentrations, respectively.

18. The method of claim 14, furthering comprising:
    forming one or more isolation features overlaying a lower portion of the fin.

19. The method of claim 14, further comprising:
    forming a gate stack overlaying respective central portions of the oxide layer and the fin, wherein the oxide layer serves as a gate dielectric layer of the fin-based transistor;
    removing side portions of the oxide layer that are not overlaid by the gate stack;
    recessing side portions of the fin that are not overlaid by the gate stack; and
    forming source and drain features in the recessed side portions of the fin.

20. The method of claim 14, wherein the oxide layer has a substantially conformal thickness.

* * * * *